United States Patent [19]
Grothause

[11] Patent Number: 5,093,658
[45] Date of Patent: Mar. 3, 1992

[54] COMMUNICATION DEVICE CAPABLE OF AMBIENT SOUND LEVEL CONTROLLED TRANSMISSIONS

[75] Inventor: Timothy A. Grothause, Sunrise, Fla.

[73] Assignee: Motorola, Inc., Schaumburg, Ill.

[21] Appl. No.: 552,957

[22] Filed: Jul. 16, 1990

[51] Int. Cl.[5] .............................. H04B 7/00
[52] U.S. Cl. .................. 340/825.44; 340/311.1; 381/56
[58] Field of Search ........... 340/531, 539, 540, 825.44, 340/825.47, 825.48, 311.1; 367/197, 198; 381/56, 57; 455/232, 234, 235; 379/40

[56] References Cited

U.S. PATENT DOCUMENTS

| | | | |
|---|---|---|---|
| 4,160,875 | 7/1979 | Kahn | 381/56 |
| 4,475,232 | 10/1984 | Shaw | 381/56 |
| 4,628,526 | 12/1986 | Germer | 381/57 |
| 4,904,992 | 2/1990 | Grothause | 340/825.44 |
| 4,935,952 | 6/1990 | Dutra | 381/56 |

FOREIGN PATENT DOCUMENTS 2136181A 9/1984 United Kingdom.

Primary Examiner—Donald J. Yusko
Assistant Examiner—Dervis Magistre
Attorney, Agent, or Firm—Pedro P. Hernandez; Daniel K. Nichols

[57] ABSTRACT

A communication device (10) measures and compares (16,18) the ambient sound level of its environment. When the current ambient sound level exceeds a given threshold (52) the communication device automatically transmits (38) an information signal (44). Optionally, the communication devices's volume is also adjusted (26).

6 Claims, 3 Drawing Sheets

COMMUNICATION DEVICE CAPABLE OF AMBIENT SOUND LEVEL CONTROLLED TRANSMISSIONS

TECHNICAL FIELD

This invention relates generally to communication devices, and more specifically to communication devices capable of automatic ambient sound level controlled transmissions.

BACKGROUND

Many contemporary communication devices offer a means of allowing the communication device user to transmit selected or predetermined information signals. For example, many communication devices have the capability of transmitting an emergency information signal when the communication device user activates an emergency switch on the communication device (this is a typical feature in communication devices used by public safety officials).

A problem arises, however, when a communication device user enters a critical or life threatening environment in which the communication device user may not have the time or presence of mind to manually activate the emergency switch. Thus, assistance may not be forthcoming. For policemen, firemen, and other emergency personnel, failure to transmit certain information signal(s) in certain situations can result in catastrophic circumstances. Accordingly, there is a need for a communication device capable of automatically transmitting predetermined signals depending upon the communication device user's environment.

SUMMARY OF THE INVENTION

Briefly, according to the invention, the communication device measures the ambient sound level of the environment. When the ambient sound level (sound pressure level) of the environment exceeds a certain predetermined threshold, the communication device automatically transmits an information signal which in the preferred embodiment is an emergency signal.

In another aspect of the present invention, the communication device can also adjust the volume level of received information signals as soon as the ambient sound level of the environment has exceeded the predetermined threshold level.

DETAILED DESCRIPTION OF THE PREFERRED EMBODIMENT

Figure 1:
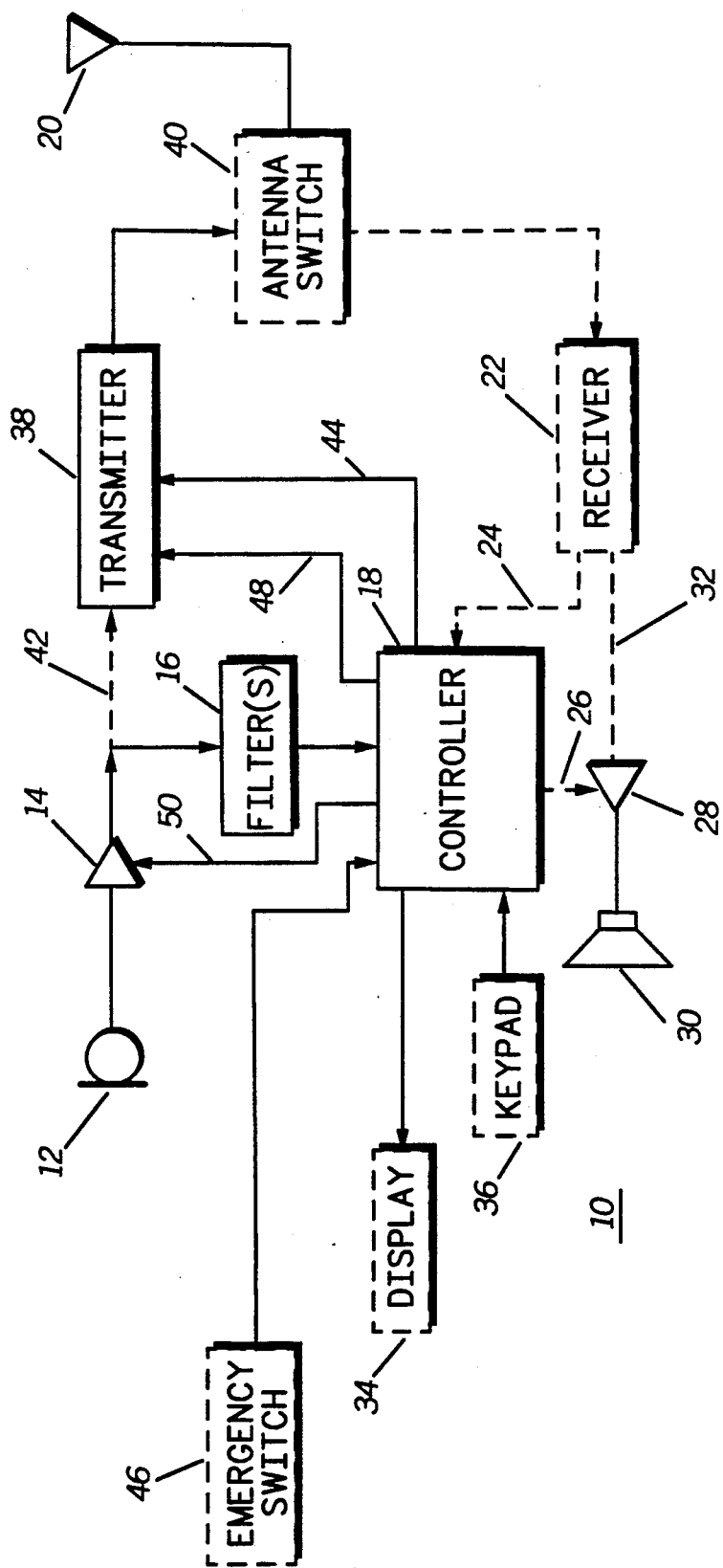
FIG. 1 is a block diagram of a communication device in accordance with the present invention.

Referring to FIG. 1, a communication device 10 preferably a radio, in accordance with the present invention includes an input means such as microphone 12, preferably one of high dynamic range, which is coupled to an amplifier 14 for providing an amplified version of the ambient sound level (sound pressure level) to a filter(s) 16. The ambient sound level or ambient sound pressure level noted also encompasses any ambient noise levels in the environment, with the ambient noise referring specifically to sounds not in the audible range.

The filter(s) 16 can select between the audible frequency band for analysis or other frequency bands or even a plurality of sub-bands may be provided by the filter 16 to the controller 18 for a more complicated spectral analysis of the surrounding sound environment so that the ambient sound level (sound pressure level) may be determined and stored. Which includes an analysis of the sound energy in the audible frequency band, or noise energy in a predetermined frequency band outside the audible frequency band. Preferably, the controller 18 comprises an MC68HC05C4 microcontroller, having on-chip analog-to-digital converters, memory, timer circuitry, control circuitry, and capable of interfacing to external memory storage devices if required. The controller 18 processes the filtered information to maintain a digital representation of the ambient sound level. This level will be compared against by a comparison means which is part of controller 18 (e.g. standard comparison algorithm) a threshold also stored within the controller 18. Any one of many digital signal processors known in the art could optionally be used as the controller 18 in conjunction with conventional ambient sound level recognition and digital comparison programs known in the art, in order to collect more precise ambient sound level information. For example, integration programs known in the art could be used to characterize, store, and compare the ambient sound level information above the stored threshold, in order to more accurately typify what type of sound exceeded the stored threshold.

To transmit a message, information signals 44 are provided to a transmission means such as transmitter 38, which may be of a conventional design. In the preferred embodiment the information signals 44 are emergency signals. Emergency signals being signals transmitted by the communication device when the user of the device is in a critical or life threatening situation. The emergency signal informs the communication device(s) receiving the emergency signal that the particular device transmiting the signal is in an emergency situation. Optionally, voice messages 42 can be transmitted as well. The transmitter is activated by the transmitter control line 48, which is controlled by the controller 18. The control line 48 is activated by the controller 18 any time the transmitter 38 needs to be "keyed up" or activated. In the present invention the control line 48 will be activated when the ambient sound (or noise) exceeds a predetermined threshold stored in the controller 18. The transmitter 38 is coupled to an antenna 20, in this way voice messages 42 and information signals 44 may be provided to the transmitter 38 to be broadcast to other receivers or transceivers.

By activating an optional external switch 46, or an optional keypad 36, which are coupled to controller 18 for processing, a communication device user can provide information signals 44 to the transmitter. According to the invention, whenever a information signal 44 is being transmitted by the transmitter 38, the controller 18 activates an amplifier control line 50 which inactivates amplifier 14 in order to avoid the ambient sound (or noise) from affecting the information signal transmission.

The present invention can be optionally incorporated as a receiver means such as transceiver by including a receiver 22 and an antenna switch 40 to selectively couple the antenna 20 to either the receiver 22 or the transmitter 38. To receive a message, a radio frequency signal is routed from an antenna 20 to a receiver 22, which may be of conventional design. The receiver 22 provides radio information signals in the form of data messages via line 24 or voice messages via line 32. The controller 18 may present received data messages via an optional display 34. The receiver 22 can also provide voice messages via line 32, which is coupled to amplifier 28 for presentation to the speaker 30.

The present invention contemplates that the radio user may enter a wide variety of sound environments in which his ability to manually send out information signal transmissions may be impaired. For example, a police officer which is engaged in a situation where gun fire is exchanged with another party. In these and other situations the user of the communication device may not have the time or presence of mind to activate the communication device's optional emergency activator 46 in order to transmit an information signal 44. In the present invention information signal 44 would take the form of an emergency signal. Accordingly, the present invention operates to compare the ambient sound level to a predetermined threshold level stored in controller 18. For example, the threshold level could be set to the approximate the sound level a gun being fired would generate. If the ambient sound level is such that the predetermined threshold level is exceeded, the present invention operates to automatically transmit an information signal 44 with out any user intervention. Those skilled in the art will appreciate the fact that the information signal that is transmitted when the ambient sound level exceeds the predetermined threshold in the controller 18 may be different in form and/or content than the information signal 44 that is transmitted when the communication device user activates the optional emergency switch 46. Thus, allowing for the communication unit receiving the transmitted information to distinguish between the emergency switch being activated, or the information signal 44 occurring due to the ambient noise exceeding the threshold level. Different information signals 44 can be stored in the controller 18 for transmission, depending if the optional emergency activator 46 is activated, or if the ambient sound level exceeded the predetermined threshold(s).

Optionally, once the ambient sound level exceeds a predetermined threshold stored in controller 18, a conventional software timer program stored in the controller 18 using the timer circuitry in the controller 18 can begin counting until the ambient sound level falls below the threshold. In this manner, a comparison of the time the ambient sound was above the stored threshold can be determined, and compared to a separate time threshold stored in the controller 18. By also measuring the time the ambient sound level stays above a given threshold and comparing this time to a time threshold stored in controller 18, the communication device can more accurately detect the difference between a sharp loud sound similar to a gun being fired, and a loud continuous background noise. Thus, by comparing both the ambient sound level exceeding a predetermined threshold as well as comparing the time the ambient sound level is above the sound level threshold to a predetermined time threshold, the communication device 10 can be more selective in transmitting the information signal 44.

Figure 3:
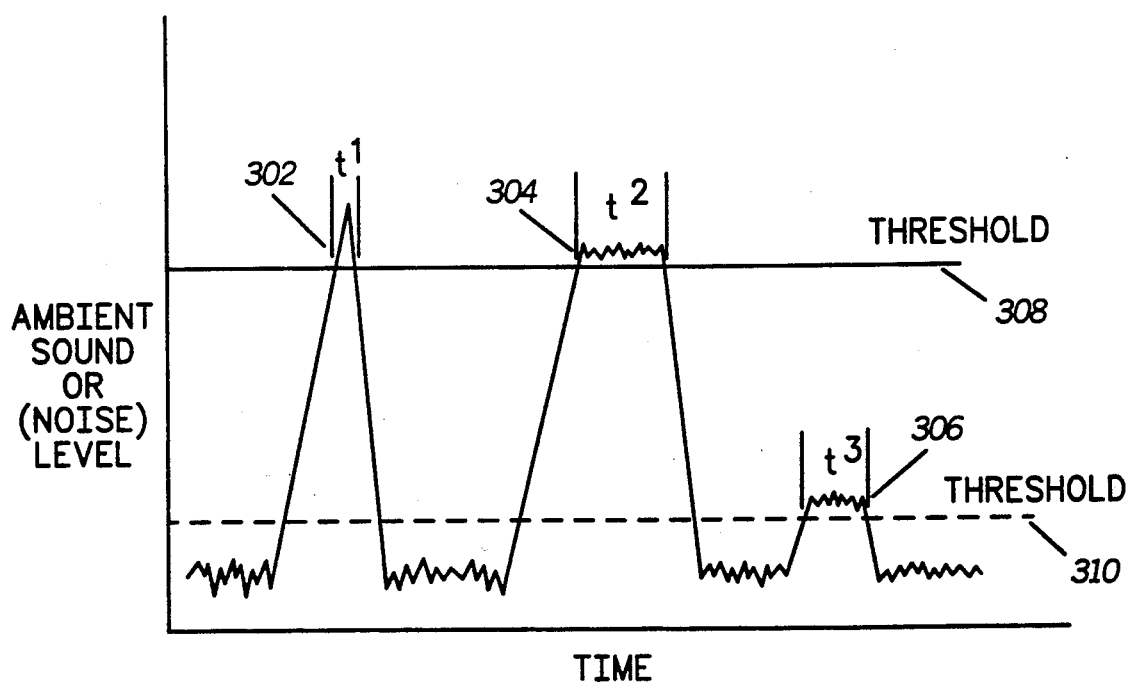
FIG. 3 is a graph of ambient sound versus time, relating to the communication device of FIG. 1.

The theory of operation of the present invention can be better understood by referring to FIG. 3. In FIG. 3, ambient sound levels versus time are graphed. The graph depicts three different sound (or noise) level peaks shown as 302, 304, and 306, as well as two different sound level thresholds, threshold 308 and an optional second threshold 310, both stored in controller 18. The first sound level peak 302 is shown surpassing the first threshold 308 for a time duration of "$t^1$", the second sound level peak 304 is shown surpassing the first threshold 308 for a time duration "$t^2$", and finally the third level peak 306 is shown surpassing the optional second threshold 310 for a time duration "$t^3$". By storing a plurality of different sound level thresholds, in this example two (308, and 310), the communication device can transmit different information signals 44 depending upon which threshold is exceeded. Also, by optionally measuring the time the ambient sound is above the threshold and comparing this time to predetermined time thresholds stored in the controller 18 the communication device can better distinguish between different ambient sound levels and thus decide whether to transmit an information signal 44.

Figure 2A:
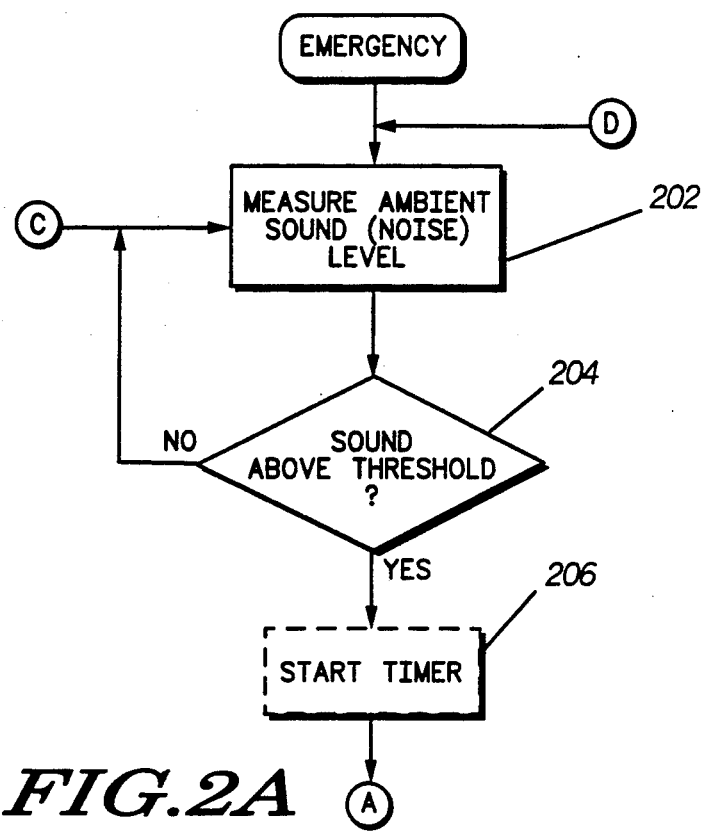
FIGS. 2A-2C are flow diagrams illustrating the operation of the communication device of FIG. 1.
Figure 2B:
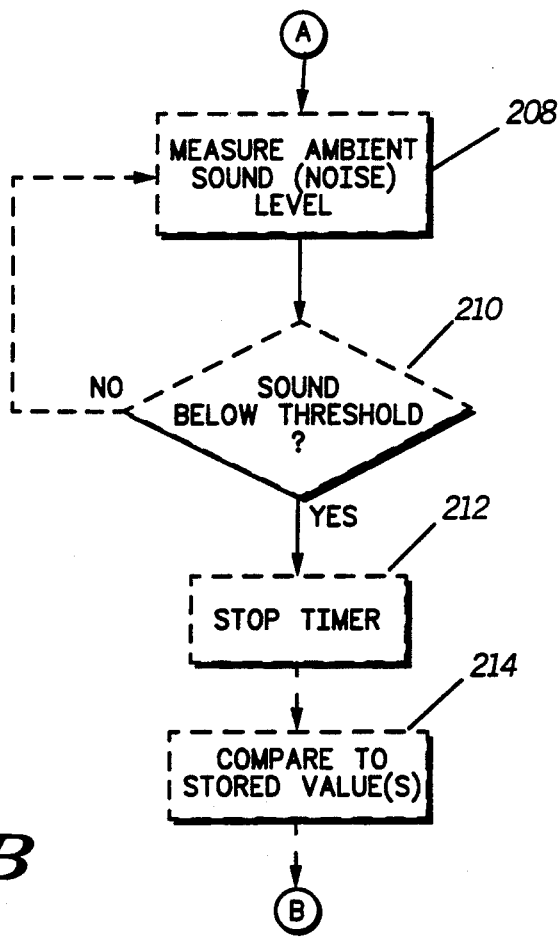
Figure 2C:
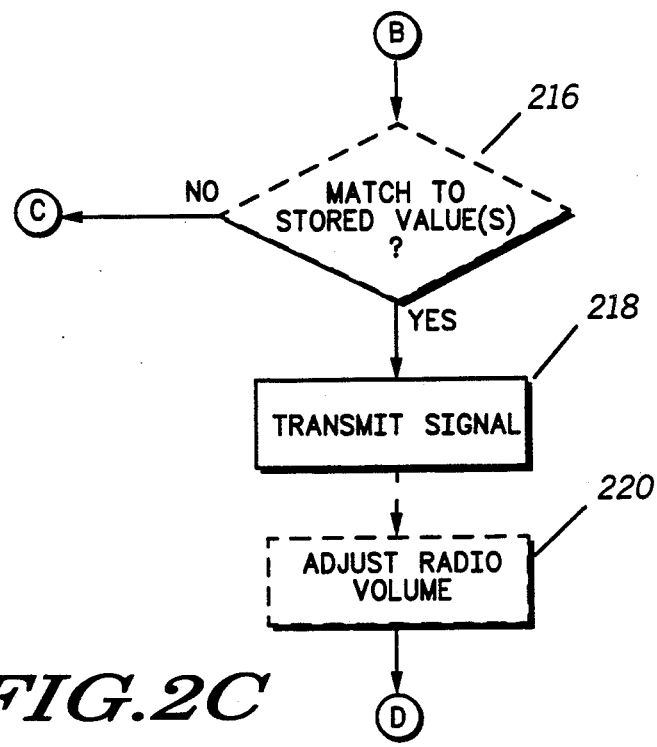

Referring to FIGS. 2A-2C, the steps executed by the communication device 10 are shown. In step 202, the ambient sound level is measured. Decision 204, determines whether the ambient sound level exceeds the predetermined threshold stored in the controller 18. If not, the routine returns to step 202, which continues to measure the ambient sound level. Optionally, step 206 starts a conventional timer program stored in controller 18. Optional steps 208 and 210 again respectively measure and compare the ambient sound level to stored threshold(s). If the ambient sound level does not exceed the stored threshold the routine returns to step 208. If the ambient sound exceeds the threshold level step 212 optionally stops the timer. Step 214 compares both the ambient sound (by using any of several known digital comparison techniques), to predetermined stored threshold(s) and also optionally compares the time above the predetermined threshold(s) against predetermined threshold(s) stored in controller 18. If the comparisons of the ambient sound level matches the predetermined stored values in controller 18, in step 216, the controller 18 activates the transmitter control line 48 which activates the transmitter 38. The controller 18 then sends an information signal 44 which is transmitted by the transmitter 38.

The communication device's volume can optionally be adjusted step 220, via the amplifier gain adjustment 26 by the controller 18 after the ambient sound level exceeds the stored threshold in the controller 18. This would increase the volume of speaker 30 to a predetermined level stored in controller 18.

Another embodiment of the present invention would measure the ambient sound level as in step 202, in step 204, decide if the threshold is exceeded. If not, return to step 202, to continue to measure the external ambient sound level. If the sound level threshold(s) stored in the controller would be exceeded, then the controller 18 would start an optional internal timer with predetermined time interval stored in the controller 18, similar to the timer sequence in step 206, but this would be a conventional count down timer. Also, a counter would start counting the number of times the ambient sound level exceeded the internal stored threshold. At this point the sequence would return to step 202, to measure the ambient noise level, followed by step 204 to decide if the internal threshold had been exceeded. Every time the threshold was exceeded the count down timer would be reset. This sequence would continue until the count down timer would expire. Once the conventional count down timer expired, the controller 18 would transmit an information signal 44. The information signal 44 would contain the information that the threshold was exceeded so many times, and would also reset the timer keeping count of how many times the internal threshold was exceeded. This embodiment would be beneficial in an example where multiple gun shots were fired. In this example, the communication device would determine the number of shots that had been fired, and transmit an information signal 44, or in this case an emergency signal that would relate this information to the receiving unit(s).

While the present invention has been described in conjunction with specific embodiments, it is evident that many alternatives, modifications and variations will be apparent to those skilled in the art in light of the foregoing description. Accordingly is intended that the present invention embrace all such alternatives modifications and variations as fall within the spirit and broad scope of the appended claims.

What is claimed is:

1. A communication device, comprising:
  input means for determining ambient sound level;
  comparison means responsive to the input means for comparing said ambient sound level to a threshold level;
  transmission means responsive to the comparison means for automatically transmitting an information signal related to the ambient sound when the ambient sound level exceeds the threshold;
  receiver means coupled to the transmission means for receiving an information signal; and
  means for automatically adjusting the volume level of the receiver means to a predetermined level in response to the ambient sound level exceeding the threshold.

2. The communication device of claim 1 wherein the input means for determining ambient sound level comprises means for determining ambient sound energy residing in an audible frequency band.

3. The communication device of claim 1 wherein the input means for determining ambient sound level comprises means for determining ambient noise energy residing in a predetermined frequency band.

4. In a communication device, a method for ambient sound level controlled transmissions, comprising the steps of:
  (a) determining the ambient sound level;
  (b) comparing the ambient sound level to a predetermined stored level;
  (c) transmitting an information signal related to the ambient sound when it is determined that the ambient sound level has exceeded a predetermined threshold;
  (d) receiving an information signal; and
  (e) adjusting the volume level of the received information signal to a predetermined level when it is determined that the ambient sound level has exceeded the threshold.

5. The method of claim 4 wherein step (a) comprises: determining sound energy residing in an audible spectral band.

6. The method of claim 4 wherein step (a) comprises: determining noise energy residing in a predetermined frequency band.

* * * * *